United States Patent
Kumar et al.

(10) Patent No.: US 10,714,319 B2
(45) Date of Patent: Jul. 14, 2020

(54) APPARATUS AND METHODS FOR REMOVING CONTAMINANT PARTICLES IN A PLASMA PROCESS

(71) Applicant: Applied Materials, Inc., Santa Clara, CA (US)

(72) Inventors: Bhaskar Kumar, Santa Clara, CA (US); Anup Kumar Singh, Santa Clara, CA (US); Vivek Bharat Shah, Sunnyvale, CA (US); Sidharth Bhatia, Santa Cruz, CA (US); Ganesh Balasubramanian, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/262,307

(22) Filed: Jan. 30, 2019

(65) Prior Publication Data
US 2019/0259585 A1    Aug. 22, 2019

Related U.S. Application Data

(60) Provisional application No. 62/633,351, filed on Feb. 21, 2018.

(51) Int. Cl.
*H01J 37/32*       (2006.01)
*H01L 21/67*       (2006.01)

(52) U.S. Cl.
CPC .. *H01J 37/32834* (2013.01); *H01J 37/32009* (2013.01); *H01J 37/3244* (2013.01); *H01J 2237/022* (2013.01); *H01L 21/67069* (2013.01)

(58) Field of Classification Search
None
See application file for complete search history.

(56) References Cited

U.S. PATENT DOCUMENTS 4,148,705 A * 4/1979 Battey ................... B01J 12/002
                                                           204/192.35
5,879,574 A * 3/1999 Sivaramakrishnan ......................
                                                          C23C 16/4405
                                                                134/1.1

(Continued)

FOREIGN PATENT DOCUMENTS

KR             101643830 B1        8/2016

OTHER PUBLICATIONS

Korean Office Action dated Feb. 25, 2020 for Application No. 10-2019-0019820.

*Primary Examiner* — Shamim Ahmed
(74) *Attorney, Agent, or Firm* — Patterson + Sheridan, LLP

(57) ABSTRACT

A method and apparatus for operating a plasma processing chamber includes performing a plasma process at a process pressure and a pressure power to generate a plasma. A first ramping-down stage starts in which the process power and the process pressure are ramped down substantially simultaneously to an intermediate power level and an intermediate pressure level, respectively. The intermediate power level and intermediate pressure level are preselected so as to raise a plasma sheath boundary above a threshold height from a surface of a substrate. A purge gas is flowed from a showerhead assembly at a sufficiently high rate to sweep away contaminant particles trapped in the plasma such that one or more contaminant particles move outwardly of an edge of the substrate. A second ramping-down stage starts where the intermediate power level and the intermediate pressure level decline to a zero level and a base pressure, respectively.

10 Claims, 4 Drawing Sheets

(56) References Cited

U.S. PATENT DOCUMENTS

| | | |
|---|---|---|
| 7,402,258 B2 | 7/2008 | Kiehlbauch et al. |
| 2008/0179288 A1 | 7/2008 | Collins et al. |
| 2013/0084654 A1 | 4/2013 | Gaylord et al. |
| 2015/0318150 A1* | 11/2015 | Fischer ............... H01J 37/3255 |
| | | 438/713 |

* cited by examiner

APPARATUS AND METHODS FOR REMOVING CONTAMINANT PARTICLES IN A PLASMA PROCESS

CROSS-REFERENCE TO RELATED APPLICATIONS

This application claims benefit of U.S. provisional patent application Ser. No. 62/633,351, filed Feb. 21, 2018, which is herein incorporated by reference.

FIELD

The present disclosure generally relates to apparatus and methods for removing contaminant particles in an end stage of a plasma processing operation.

DESCRIPTION OF THE RELATED ART

In the manufacture of high density integrated circuits using a plasma processing chamber, contaminant particles are derived from by-products of reactant gases and other by-products already attached to interior surfaces of the plasma processing chamber. These contaminant particles are trapped in a plasma region during a plasma process. As the processing ends and the plasma region collapses, the contaminant particles fall onto the substrate, leading to a decreased yield or reduced reliability of semiconductor products formed from the substrate.

Therefore, there is a need for apparatus and methods that address the contaminant particle issues in a plasma process.

SUMMARY

The present disclosure provides apparatus and method for removing contaminant particles in the end stage of the plasma processing.

In one aspect, a method of operating a plasma processing chamber is provided. The method includes performing a plasma process at a process pressure and a process power to generate plasma; ramping down the process power and the process pressure substantially simultaneously to an intermediate power level and an intermediate pressure level, respectively, wherein the intermediate power level and the intermediate pressure level are selected so as to raise a plasma sheath boundary above a threshold height from a surface of a substrate; maintaining the intermediate power level for a first time period and maintaining the intermediate pressure level for a second time period while flowing a purge gas from a showerhead assembly; and reducing the intermediate power level and the intermediate pressure level to a zero power level and a base pressure, respectively.

In one aspect, an apparatus for performing a plasma process is provided. The apparatus includes a processor; and a memory storing computer program code configured to, with the processor, cause the apparatus to perform a plasma process at a process pressure and a process power to generate plasma in a plasma processing chamber; ramp down the process power and the process pressure substantially simultaneously to an intermediate power level and an intermediate pressure level, respectively, wherein the intermediate power level and the intermediate pressure level are selected so as to raise a plasma sheath boundary above a threshold height from a surface of a substrate; maintain the intermediate power level for a first time period and maintain the intermediate pressure level for a second time period while flowing a purge gas from a showerhead assembly; and reduce the intermediate power level and the intermediate pressure level to a zero power level and a base pressure, respectively.

In one aspect, an apparatus for performing a plasma process is provided. The apparatus includes a processor; and a memory storing computer program code configured to, with the processor, cause the apparatus to perform a plasma process at a process pressure and a process power to generate plasma in a plasma processing chamber; select an intermediate power level and an intermediate pressure level; ramp down the process power and the process pressure substantially simultaneously to the intermediate power level and the intermediate pressure level, respectively; maintain the intermediate power level for a first time period and maintain the intermediate pressure level for a second time period while flowing a purge gas from a showerhead assembly; and reduce the intermediate power level and the intermediate pressure level.

BRIEF DESCRIPTION OF THE DRAWINGS

So that the manner in which the above recited features of the present disclosure can be understood in detail, a more particular description of the disclosure, briefly summarized above, will be provided by reference to aspects, some of which are illustrated in the appended drawings. It is to be noted, however, that the appended drawings illustrate only exemplary aspects and are therefore not to be considered limiting of the scope of the disclosed and claimed aspects, and the disclosure may admit to other equally effective aspects.

FIG. 4A illustrates a schematic cross-sectional view of the processing chamber during a plasma process stage in accordance with one aspect of the present disclosure.

FIG. 4B illustrates a schematic cross-sectional view of the processing chamber during an intermediate flat stage in accordance with one aspect of the present disclosure.

FIG. 4C is a schematic cross-sectional view of the processing chamber during a plasma extinguished stage in accordance with one aspect of the present disclosure.

DETAILED DESCRIPTION

Figure 1:
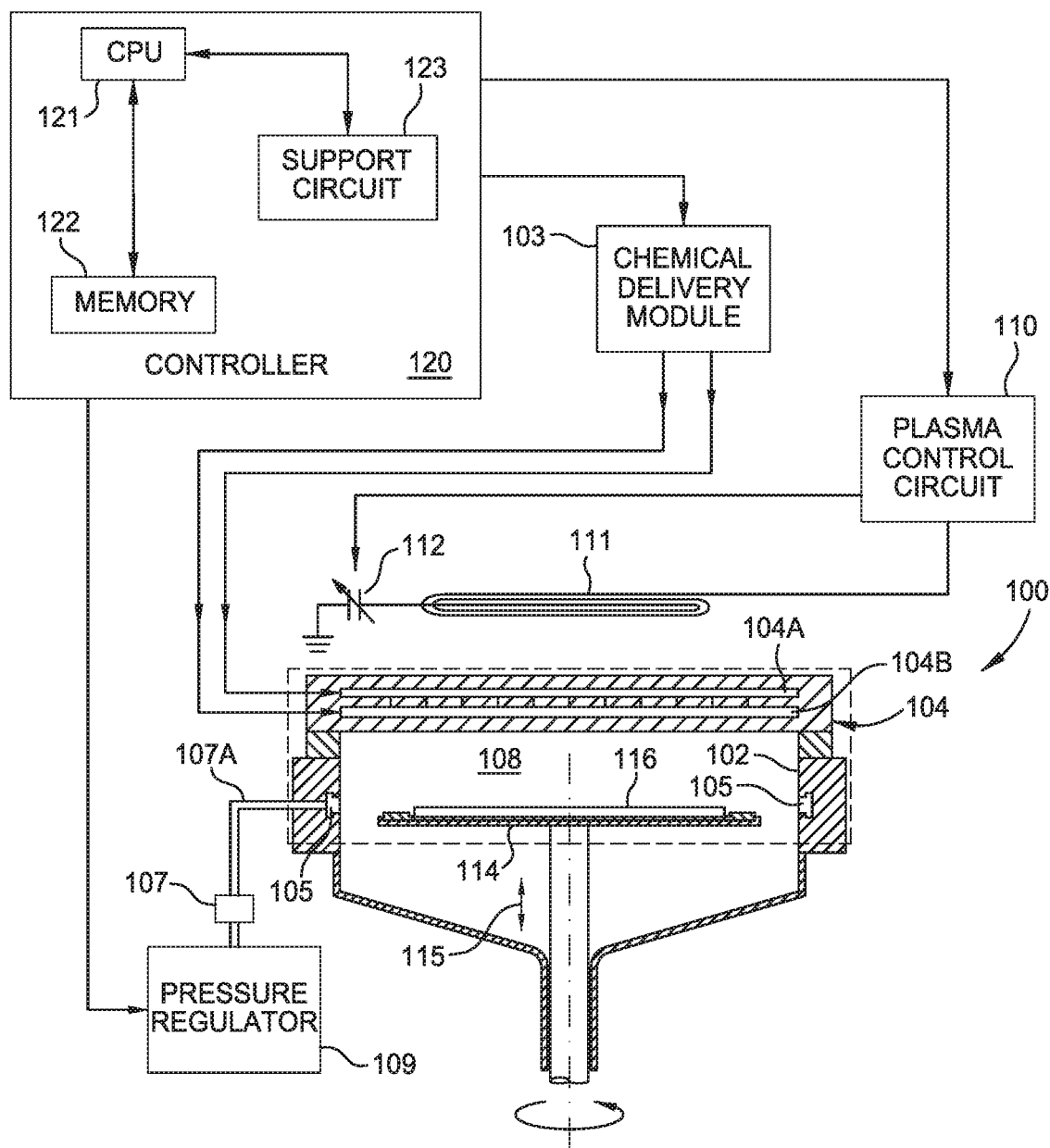
FIG. 1 is a schematic sectional view of a plasma processing chamber according to one aspect of the present disclosure.

FIG. 1 is a schematic sectional view of a plasma processing chamber 100 according to one aspect of the present disclosure. The plasma processing chamber 100 comprises a chamber 102, a showerhead assembly 104, a processing volume 108, a chemical delivery module 103, a plasma control circuit 110, a substrate support 114, and a pressure regulator 109.

Chemical delivery module 103 delivers various gases including precursor gases, carrier gases, and/or purge gases to the showerhead assembly 104 from one or more gas sources. The gas sources may also supply purge gas to the showerhead assembly 104.

The showerhead assembly 104 here includes multiple processing gas channels including a first processing gas channel 104A and a second processing gas channel 104B, through which multiple process gases are delivered to the processing volume 108 independently.

During processing thereof, a substrate 116 is disposed on the substrate support 114 which has the capability of moving up and down in a vertical direction 115. The substrate support 114 also includes a temperature control element, such as a heater, a plurality of cooling channels, or both for controlling the temperature of the substrate 116.

A plurality of exhaust ports 105 are formed on an inside wall of the chamber 102 around the substrate support 114. The exhaust ports 105 are connected to a pressure regulator 109 via one or more exhaust channels 107A. The pressure regulator 109 includes a vacuum pump 107 which, in consideration of gas(es) flowing into the showerhead, controls a chamber pressure and a rate at which the exhaust gases are drawn from the chamber.

Plasma control circuit 110 is coupled to a coil 111, and the plasma control circuit 110 supplies radio frequency (RF) or other AC power to the coil 111 to generate a plasma in the processing volume 108. The coil 111 is connected to ground through a variable capacitor 112.

The plasma processing chamber 100 includes a controller 120 to control aspects of the plasma processing chamber 100 during plasma processing. The controller 120 comprises a central processing unit (CPU) 121, a memory 122, and a support circuit 123 for the CPU 121. The controller 120 facilitates control of the components of the plasma processing chamber 100. The controller 120 may be one of any form of general-purpose computers that can be used in an industrial setting for controlling various chamber components and sub-processors. The memory 122 stores software (source or object code) that may be executed or invoked to control the overall operations of the plasma processing chamber 100 in manners described herein. The controller 120 manipulates respective operations of controllable components in the plasma processing chamber 100. For example, the controller 120 controls the operations of the chemical delivery module 103, plasma control circuit 110 and pressure regulator 109 for eliminating or reducing contaminant particles in a plasma process as described herein.

During a plasma process, the chemical delivery module 103 delivers precursor gases, carrier gases, and/or purge gases to the showerhead assembly 104 through supply lines according to the aspects of a particular process. Subsequently, the showerhead assembly 104 distributes gases across the processing volume 108. Unreacted gases, and reaction products or gas reactants, exit the plasma processing chamber 100 through the exhaust ports 105.

Plasma control circuit 110 provides a radio frequency (RF) or other AC voltage across the coil 111 to produce a voltage profile on the coil 111, which generates a plasma region within the process volume 108. By varying the value of the variable capacitor 112, the voltage profile on the coil 111 can be varied. Plasma control circuit 110 includes a power supply, and may, for example, supply up to about 4000 Watts at a tunable frequency in a range, e.g., from 50 kHz to 13.56 MHz, Other frequencies and RF or AC powers may be provided for particular applications. In some embodiments, which may be combined with other embodiments, an additional RF match circuit is connected to another power supply and is configured to supply RF or AC power to a cathode equipped with an electrostatic chuck or other substrate support element to control energy of plasma ions bombarding the substrate.

Figure 2:
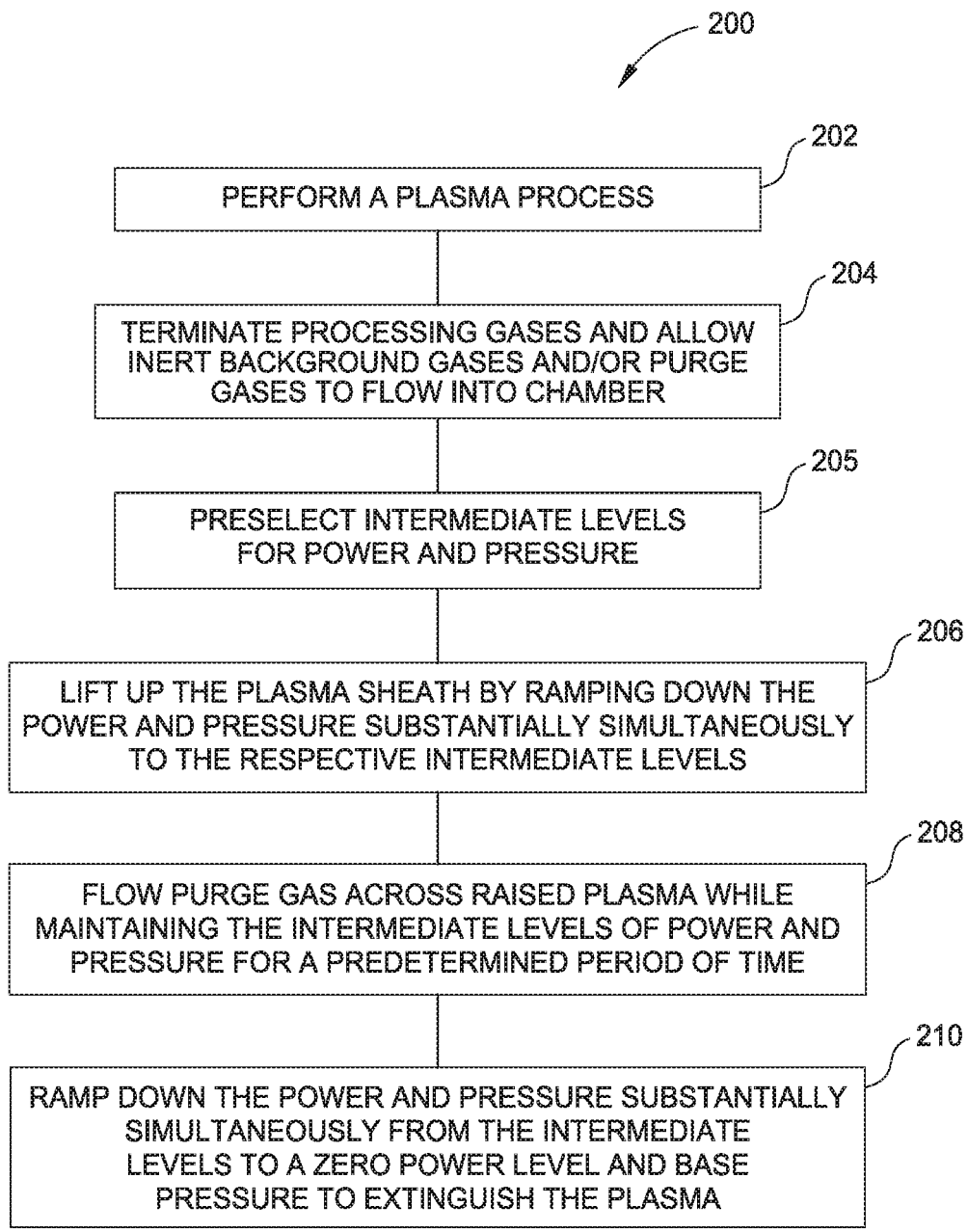
FIG. 2 is a flowchart illustrating operations of reducing or eliminating contaminant particles in accordance with one aspect of the present disclosure.

FIG. 2 is a flowchart illustrating operations for reducing or eliminating contaminant particles depositing on a substrate during plasma processing, in accordance with one aspect of the present disclosure.

In act 202, the plasma processing chamber performs a plasma process using a process-specific RF or AC power and a process-specific chamber pressure. Various RF or AC power and chamber pressure levels may be specified to generate a plasma having predetermined properties for different plasma processes including, for example, a deposition process and an etching process. At the completion of the plasma process, the processing chamber controller turns off the supply of a processing gas, such as an etchant or deposition precursor, in act 204, and allows an inert background (e.g., carrier) or purge gas, such as argon, to continue to flow into the chamber.

In act 205, intermediate levels for power and pressure are preselected. It is contemplated that operation 205 may alternatively occur prior to either or both of operations 202 and 204.

In act 206, the plasma process enters a first ramping-down stage where one or both of the RF or AC power for a plasma and the chamber pressure are ramped down substantially simultaneously to respective preselected intermediate levels. In some embodiments, the intermediate power level is sufficiently high such that the plasma region is able to trap the contaminant particles therein. In some embodiments, the intermediate pressure level is low enough such that the plasma sheath is raised above a threshold height above the surface of the substrate on the substrate support in the chamber. In some embodiments, the threshold height ranges from 0.5 mm to 2.0 mm above an upper surface of the substrate. For example, the threshold height may range between 1.0 mm to 1.5 mm. In some embodiments, the threshold height is about 1.3 mm from the substrate.

In act 208, the RF or AC power is maintained at the intermediate power level for a first time period, and the chamber pressure is maintained at the intermediate pressure level for a second time period. During the intermediate power and pressure stages, a purge gas is flowed from the showerhead assembly at a sufficiently high rate to sweep away the contaminant particles trapped over the lifted plasma sheath out of the edge of the substrate. In one example, the first time period is equal to the second time period. In another example, the first time period is greater than or less than the second time period.

In act 210, the RF and/or other AC power and the chamber pressure are substantially simultaneously ramped down to the zero power level and to a base pressure, respectively. As the second ramping down stage progresses, the plasma extinguishes and the contaminant particles entrained in the purge gas flow exit the processing chamber through the exhaust ports.

The method 200 shown is not limited to the sequence or number of acts illustrated in FIG. 2, but may include embodiments that include re-ordering, repeating, adding, and/or removing one or more of the acts 202, 204, 205, 206, 208, and/or 210.

Figure 3A:
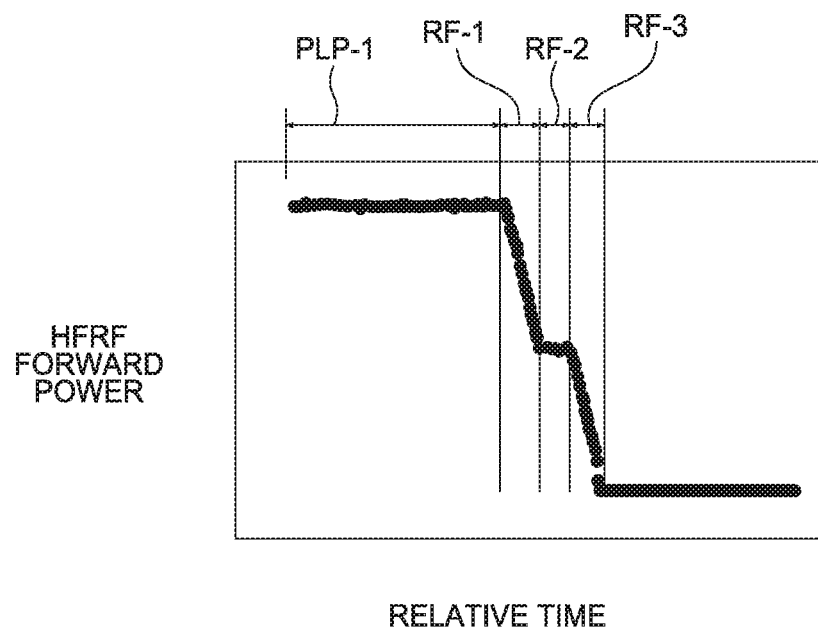
FIG. 3A is a graph illustrating changes of RF or AC power in transition from a plasma process stage to a plasma extinguished stage in accordance with one aspect of the present disclosure.

FIG. 3A is a graph illustrating changes of RF or other AC power in transition from a plasma process stage to a plasma extinguished stage in accordance with one aspect of the present disclosure.

The processing chamber performs a plasma process at the specified RF or AC power and chamber pressure for the process being undertaken, for example etching or depositing of a film layer on a substrate, until the plasma process is completed. In the embodiment illustrated in FIG. 3A, the processing chamber performs a plasma process PLP-1 at a RF or AC power (e.g., a power process value), for example, of about 150 watts and a chamber pressure (e.g., a pressure process value) of, for example, 8 Torr for a predetermined time, such as about 45 seconds.

Once the plasma process PLP-1 is complete, the chamber controller turns off the supply of the processing gases and enters the first ramping-down stage, RF-1, where the value of the RF or AC power is ramped down from the process value to the intermediate power level. In some embodiments, the intermediate power level is high enough to maintain the plasma such that the plasma is able to contain the contaminant particles therein. In some embodiments, which may be combined with other embodiments, the intermediate RF or AC power ranges from 40% to 60% of the RF or AC power of the process value. For example, the intermediate power level can be about 50% of the RF or AC power of the process value.

During the first ramping-down stage RF-1, the chamber pressure declines substantially simultaneously with the RF or AC power decline, so that the plasma in the processing volume becomes narrower in the direction orthogonal to the substrate supporting surface. The plasma widens in the radial direction of the substrate supporting surface, as the plasma sheath expands and the sheath boundary becomes raised above a threshold height above the substrate or above the substrate supporting surface. As the plasma becomes narrower in the direction orthogonal to the substrate supporting surface and wider in the radial direction of the substrate supporting surface, and as the plasma sheath is raised, the contaminant particles are pushed outwardly, in the radial direction of the substrate or the substrate supporting surface within the plasma and are trapped in the plasma in the region over the outer peripheral area of the substrate or the substrate supporting surface. In some embodiments, the threshold height, or the height of the plasma sheath boundary, is increased by 20% to 40% compared to the height of the plasma sheath boundary during substrate plasma processing, e.g., the dark space thickness over the substrate is increased by 20% to 40% compared to the height or thickness thereof during the plasma processing of the substrate. For example, in a case where an average height of plasma sheath is 1.0 mm from the substrate during the plasma process, the threshold height can be about 1.3 mm from the substrate during the first stage of the particle removal process. As a result, the contaminant particles trapped in the plasma sheath are also lifted up from the substrate.

Once the RF or AC power has declined to the intermediate RF or AC power level, the processing chamber enters the intermediate flat stage RF-2 where the RF or AC power is maintained at a constant intermediate power level for a first time period. The first time period of the RF-2 stage can be a suitable period of time long enough to remove the contaminant particles trapped in the plasma sheath. In some embodiments, the first time period ranges from 2 seconds to 10 seconds. In the embodiment illustrated in FIG. 3A, the first time period is about 3 seconds.

During this intermediate flat stage RF-2, the processing chamber flows a purge gas from the showerhead assembly at a sufficiently high enough rate to sweep away the contaminant particles trapped in the plasma sheath outwardly beyond the edge of the substrate. The swept away contaminant particles exit the chamber through the exhaust ports. Examples of purge gases which may be used include, but are not limited to, helium (He), argon (Ar), nitrogen (N2), hydrogen (H2), or a mixture thereof.

Once the intermediate flat stage RF-2 is complete, the processing chamber enters the second ramping-down stage RF-3 stage where the RF or AC power is reduced to the zero level substantially simultaneously with the decline of the chamber pressure to a base pressure (e.g.; atmospheric pressure). By the end of the second ramping-down stage RF-3, the plasma is extinguished.

Figure 3B:
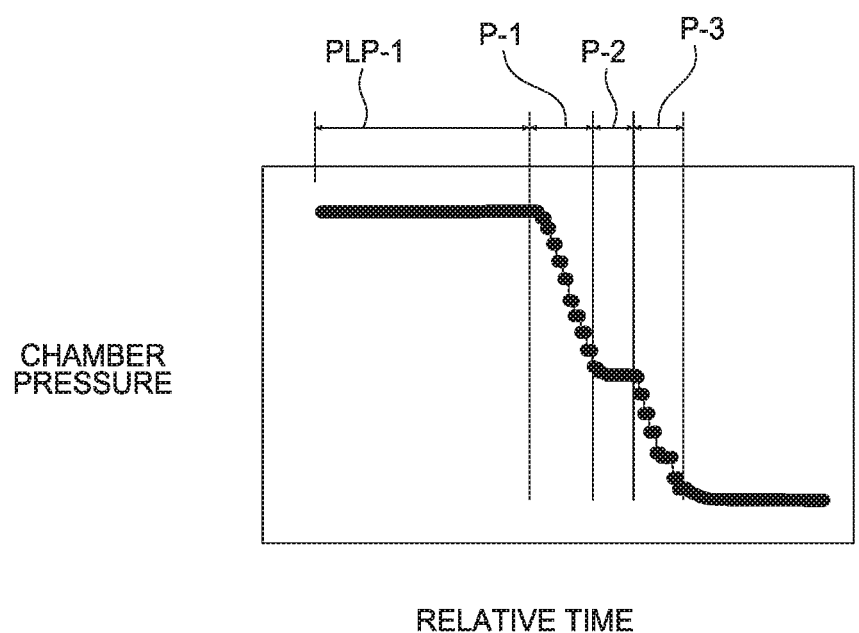
FIG. 3B is a graph illustrating changes of a chamber pressure in transition from a plasma process stage to a plasma extinguished stage in accordance with one aspect of the present disclosure.

FIG. 3B is a graph illustrating changes of the chamber pressure in transition from a plasma process stage to a plasma extinguished stage in accordance with one aspect of the present disclosure.

As illustrated, the processing chamber performs a plasma process PLP-1 at the process power value, for example 150 watts, and a process pressure value, for example 8 Torr, for a predetermined time such as until the plasma process is complete. It is to be noted that other process power values and other process pressure values may be used.

Once the plasma process is complete, the chamber controller turns off the supply of the processing gas and enters the first ramping-down stage P-1 where the process pressure is ramped down to the intermediate pressure level. The first ramping-down stage P-1 for the chamber pressure can occur substantially simultaneously with the first ramping-down stage RF-1 for the RF or AC power.

The intermediate pressure level is low enough so that the plasma sheath is raised above a threshold height as described above. In some embodiments, the intermediate pressure level ranges between 40% to 60% of the process pressure used during processing of the substrate during PLP-1. For example, the intermediate pressure level can be about 50% of the process pressure used during the plasma processing on the substrate.

Once the chamber pressure has declined to the intermediate pressure level, the processing chamber starts the intermediate flat stage P-2 where the intermediate chamber pressure is maintained for a second time period. The second time period of the intermediate flat stage P-2 can be a suitable period of time long enough to remove the contaminant particles trapped in the plasma sheath by sweeping them out with a purge gas. In some embodiments, the first time period of the intermediate flat stage RF-2 is about the same as the second time period of the intermediate flat stage P-2. In some embodiments, the second time period of P-2 stage is longer than the first time period of intermediate flat stage RF-2. In some embodiments, the second time period ranges from about 2 seconds to 10 seconds. In some embodiments, the second time period is about 4 seconds.

During this intermediate flat stage P-2, purge gas is flowed into the chamber from the showerhead assembly at a sufficiently high rate to sweep the contaminant particles trapped in the plasma sheath outwardly of the edge of the substrate.

Once the intermediate flat stage P-2 is complete, the processing chamber enters the second ramping-down stage P-3 stage where the chamber pressure declines to a base pressure level substantially simultaneously as the RF or AC power declines to about the zero level. At the end of the second ramping-down stage P-3, the plasma can be extinguished. Here, the base pressure refers to a chamber pressure used before a plasma process starts. For example, the base pressure can be an atmospheric pressure.

Figure 4A:
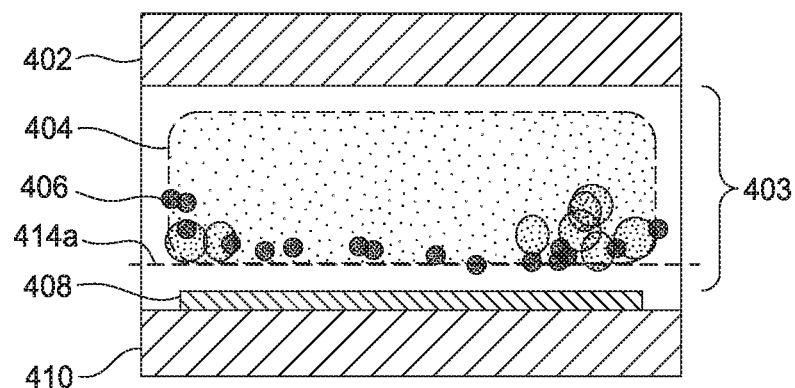
FIGS. 4A to 4C are cross-sectional views illustrating changes of a plasma in a processing volume during a transition from a plasma process stage to a plasma extinguished stage according to aspects of the present disclosure.
Figure 4B:
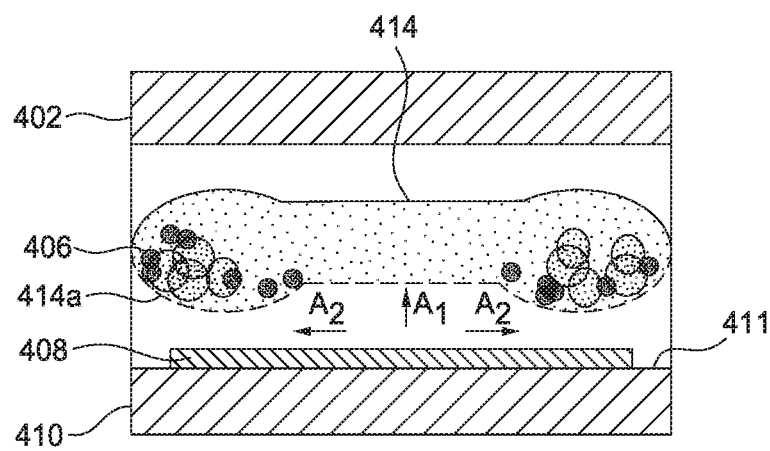
Figure 4C:
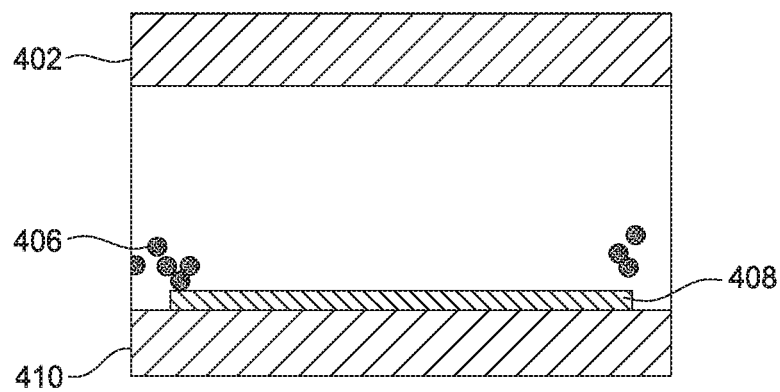

FIGS. 4A to 4C are cross-sectional views illustrating changes in a processing volume 403 during a transition from a plasma process stage to a plasma extinguished stage according to aspects of the present disclosure.

FIG. 4A illustrates a schematic cross-sectional view of the processing chamber during a plasma process in accordance with one aspect of the present disclosure.

As illustrated, a substrate 408 is located on the substrate support 410. Then, process gases are introduced into the processing volume 403 through the showerhead 402, and a specified RF or AC power and a specified chamber pressure are applied to generate a plasma 404 between a showerhead 402 and the substrate support 410. As a plasma process proceeds, the contaminant particles 406 can occur from, for example, by-products of reactant gases and can be trapped in a plasma 404.

FIG. 4B illustrates a schematic cross-sectional view of the processing chamber during the intermediate flat stage in accordance with one aspect of the present disclosure.

Once the plasma process is complete, the chamber controller turns off the supply of the processing gas precursor, and the processing chamber enters the first ramping-down stage where the RF or AC power and the chamber pressure are ramped down substantially simultaneously to the intermediate power level and the intermediate pressure level.

Once the RF or AC power and the chamber pressure reach the intermediate power level and the intermediate pressure level, respectively, the processing chamber enters the intermediate flat stage where the intermediate power level is maintained for the first time period, and the intermediate pressure level is maintained for the second time period. During the intermediate flat stage, the plasma 404 can become narrower in a direction $A_1$ orthogonal to a surface 411 of the substrate support 410 and wider in a radial direction $A_2$ of the surface 411 of the substrate support 410. Additionally, the plasma sheath 414a may raise from the substrate 408 as a result of a reduced RF or AC power and chamber pressure. As the plasma becomes narrower and the plasma sheath is raised, the contaminant particles move outwardly with respect to the substrate 408 and become located in the plasma over the outer peripheral area of the substrate.

During the intermediate flat stage, the processing chamber flows a purge gas across the processing volume at a high rate and pumps the purge gas out through a vacuum pump so that the contaminant particles trapped in the plasma sheath are swept away through the exhaust ports provided on the wall around the substrate.

FIG. 4C is a schematic cross-sectional view of the processing chamber at the plasma extinguished stage in accordance with one aspect of the present disclosure.

At the end of the intermediate flat stage, the processing chamber enters the second ramping-down stage where the RF or AC power and the chamber pressure substantially simultaneously decline to the zero level and the base pressure, respectively. At the end of the second ramping-down stage, the plasma may be extinguished and the remaining contaminant particles 406 may exit the chamber and into exhaust ports. As a result, the plasma collapses and the contaminant particles are removed or reduced, which can prevent the remaining contaminant particles 406 from falling on the substrate 408.

While the foregoing is directed to aspects and embodiments of the present disclosure, other aspects and embodiments of the disclosure may be devised without departing from the basic scope thereof, and the scope thereof is determined by the claims that follow.

What is claimed is:

1. A method of operating a plasma processing chamber, the method comprising:
    performing a plasma process at a process pressure and a process power to generate plasma;
    ramping down the process power and the process pressure substantially simultaneously to an intermediate power level and an intermediate pressure level, respectively, wherein the intermediate power level and the intermediate pressure level are selected so as to raise a plasma sheath boundary above a threshold height from a surface of a substrate;
    maintaining the intermediate power level for a first time period and maintaining the intermediate pressure level for a second time period while flowing a purge gas from a showerhead assembly; and
    reducing the intermediate power level and the intermediate pressure level to a zero power level and a base pressure, respectively.

2. The method of claim 1, wherein the intermediate power level is high enough such that the plasma is able to contain one or more contaminant particles therein.

3. The method of claim 1, wherein the threshold height of the plasma sheath boundary is at least 30% higher than a height of a plasma sheath boundary during the plasma process.

4. The method of claim 1, wherein the intermediate power level is between about 40% to about 60% of the process power.

5. The method of claim 1, wherein the intermediate power level is about 50% of the process power.

6. The method of claim 1, wherein the intermediate pressure level ranges from about 40% to about 60% of the process pressure.

7. The method of claim 1, wherein the intermediate pressure level is about 50% of the process pressure.

8. The method of claim 1, wherein the purge gas includes helium (He), argon (Ar), nitrogen (N2), hydrogen (H2), or a mixture thereof.

9. The method of claim 1, wherein the purge gas exits the plasma processing chamber through one or more exhaust ports disposed on an inside wall of the plasma processing chamber around a substrate support.

10. The method of claim 1, wherein the first time period is about the same as the second time period, or the first time period is shorter than the second time period.

* * * * *